July 31, 1951 C. N. EHRLICH 2,562,263

TUNING UNIT WITH TRIMMING CONDENSER

Filed Aug. 24, 1949 2 Sheets-Sheet 1

INVENTOR.
CHARLES N. EHRLICH
BY Theodore Hafner
ATTORNEY

July 31, 1951 C. N. EHRLICH 2,562,263

TUNING UNIT WITH TRIMMING CONDENSER

Filed Aug. 24, 1949 2 Sheets-Sheet 2

INVENTOR.
CHARLES N. EHRLICH
BY [signature]
ATTORNEY

Patented July 31, 1951 2,562,263

UNITED STATES PATENT OFFICE 2,562,263

TUNING UNIT WITH TRIMMING CONDENSER

Charles N. Ehrlich, New York, N. Y., assignor to Tele-Tone Radio Corporation, a corporation of New York Application August 24, 1949, Serial No. 112,099

5 Claims. (Cl. 175—41.5)

This invention relates to a condenser mounting and driving mechanism such as used in radio receivers and more particularly to a fine-tuning or trimming condenser associated with a channel selector or tuner in television apparatus.

In the past it has been difficult to design trimming condensers which could be placed in any part of the tuning device. Also it was difficult to reduce stray capacity and to shorten connections while controlling the tuning movement from the front of the receiver panel.

A further difficulty was to assemble the means for channel selection and condenser adjustment in a simple and inexpensive manner yet insuring accuracy of adjustment with least exposure to electric interference.

One of the objects of this invention is to reduce the coupling mechanism between condenser and panel knobs to a minimum.

A further object of the invention is to arrange tuning and capacity adjustments in such a way as to arrive at a compact piece of equipment which is simple in manufacture and assembly and accurate in operation.

Another object of the invention is a simple mounting for the condenser, for example a condenser supported on a terminal.

Still another object of the invention is a tuning unit including a trimming condenser which may be easily adapted to and connected with circuits or circuit elements of a high frequency instrument such as a television receiver.

It is a specific object of the invention to provide a tuning unit combining rotary motion for channel selection with translatory motion for the trimming capacity, both motions being preferably independent from each other, and the direction of translatory motion being substantially parallel to the axis of rotary motion.

Another object of the invention is a single member controlling these different and preferably independent motions.

Still another object of the invention is a specific trimming condenser and its connections with an oscillator controlled thereby.

These and other objects of the invention will be described more fully in connection with the accompanying drawings of which:

Figures 5, 6, 7, 8, 9, 10:
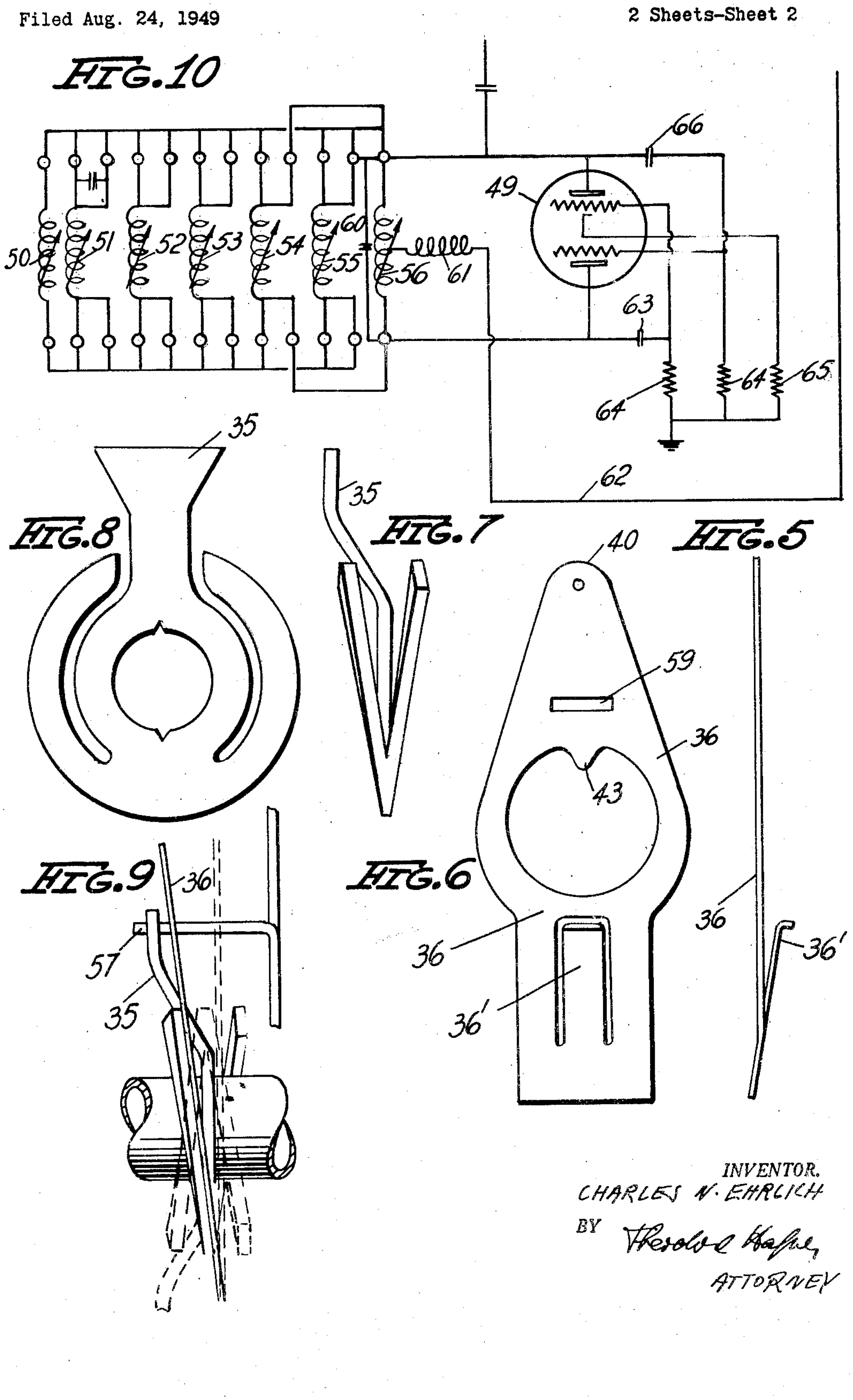
Figures 5 and 6 show in side and front elevations a coupling member controlling rotary and translatory motion mechanisms.

Figures 7 and 8 also in side and front elevations show a cam member forming part of the rotary motion mechanism.

Figure 9 explains the interaction of the coupling member shown in Figures 5 and 6 with the cam member shown in Figures 7 and 8.

Figure 10 illustrates diagrammatically the elements and the connections of the tuning mechanism with the circuit elements of a television receiver.

Figures 1, 2:
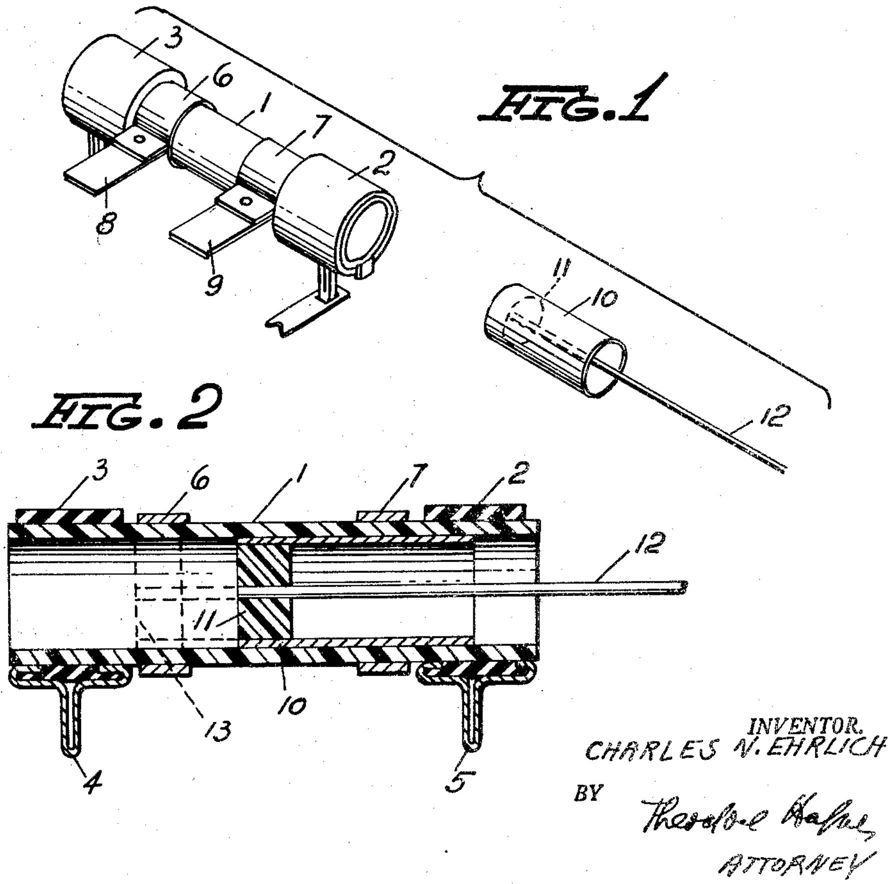
Figure 1 represents in perspective a trimming condenser embodying certain features of the invention.
Figure 2 represents the condenser in section at an enlarged scale.

In Figures 1 and 2, 1 is a tubing of paper, Bakelite, or other insulating material.

Supported thereon there are two cardboard rings 2 and 3 which serve to hold metal clips 4 and 5, adapted to support the trimming condenser and also to form electrical connections to its electrodes. These electrodes are constituted by a pair of spaced, ring-shaped metal straps 6 and 7. Metal straps 6 and 7 are shown to be provided with terminal ends 8, 9 so as to form electrical connections, separate and independent if necessary from the mechanical connections constituted by metal clips 4 and 5.

Inside tubing 1 there extends a metal cylinder 10 which may consist of sheet metal or of metallized paper or plastic. Metal cylinder 10 is supported on an insulator 11, which in turn is held by spring wire 12. Plunger unit 10, 11, 12 is shown in Figure 2 in a position for capacity at minimum. The position of plunger unit 10, 11, 12 for capacity at maximum is shown in dotted lines in Figure 2, at 13.

Figure 3:
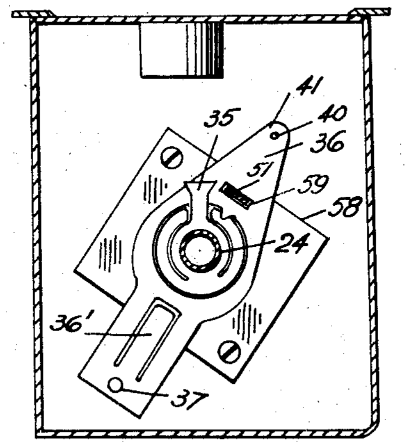
Figures 3 and 4 show a condenser mounted together with a channel selector unit, in front and side elevations respectively.
Figure 4:
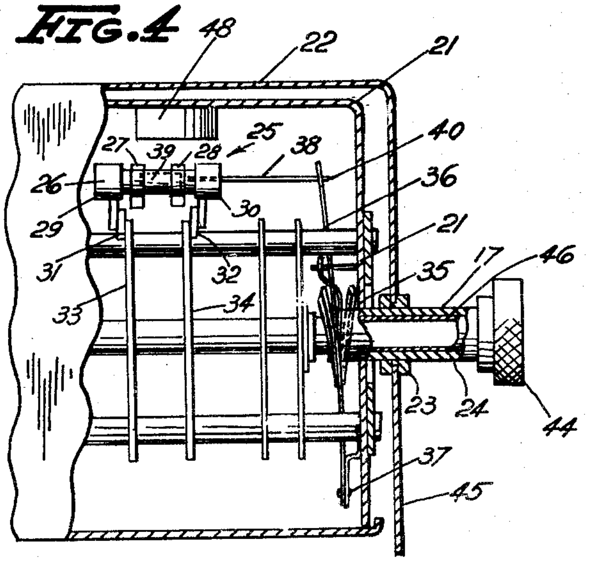

In Figures 3 and 4 there is shown a channel selector unit 21, which is attached to chassis 22 supporting a bushing 23 in which the hollow rotatable shaft 24 is mounted. Also mounted on tuning unit 21 there is a trimming condenser 25 consisting of a paper cylinder 26 provided with spaced metal sleeves 27 and 28. The entire condenser 26 is supported on, and connected over end clips 29 and 30, to terminals 31, 32 of wafers 33, 34 of tuning unit 21.

Condenser 26 may be supported on, or attached to any sorts of terminals such as the terminals of a tube socket, without exceeding the scope of the invention.

In this way the length of the leads is held to a minimum and stray capacities are practically reduced to zero. At the same time the condenser adjustment may be effected in accordance with the invention in a very simple way without any undue stress on the condenser mounting.

As illustrated more clearly in Figure 3 there is attached to hollow shaft 24, a cam washer 35 which is fastened to shaft 24 by soldering or any other method of attachment. Cam washer 35 in the course of its rotation and at different points of its periphery, engages cam follower 36, one end of which is attached at point 37 to unit 21. Cam follower 36 is provided with a spring extension 36' which urges cam follower 36 to continuously contact with cam washer 35.

The other end of cam follower 36 is attached to spring wire 38 which is used for the variation of capacity of condenser 25.

The capacity of condenser 25 is varied by adjustably inserting into paper cylinder 26 a metallic or metallized plunger 39 insulatingly mounted at one end of spring wire 38 the other end of which is attached, as by soldering, at point 40 to end 41 of cam follower 36.

Cam follower 36 is shown at an enlarged scale in Figures 5 and 6, cam washer 35 in Figures 7 and 8.

As illustrated more clearly in Figure 9, rotation of knob 44 causes rotation of hollow shaft 24 and thereby rotation of cam washer 35 and frictional engagement of cam follower 36 with cam washer 35 at successive peripheral points of the latter. Due to the rotary movement of cam washer 35, cam follower 36, at a central portion 43 thereof, is elastically pushed backward and forward depending upon the direction of rotation of knob 44. Thereby, the adjustable plunger 39 which is insulatingly coupled over wire 38 to cam follower 36 is also pushed backward and forward, and thus the capacity of condenser 25 is varied. Hollow shaft 24 contains a second shaft 46 which permits rotary movement of the channel selection unit independent of the tuning adjustment of trimmer condenser 25, all these movements occurring under control of knob 44 from the front of chassis 22. 45 is a housing side plate for chassis 22 for supporting tubes (not shown) on sockets 48. One of these tubes is shown in the circuit diagram of Figure 10 at 49 in which 50 through 56 represent a number of tuning coils mounted on a chassis such as shown in Figures 3 and 4.

Rotation of cam washer 35 and adjustment of condenser 25 are stopped by projection 57 of plate 58 extending through the opening 59 of cam follower 36 in the path of cam washer 35 (Fig. 9).

The trimming condenser 25 is diagrammatically indicated in Fig. 10 at 60, arranged across inductance 56 the center tap of which is grounded or applied to a fixed positive potential of say 150 volts, over inductance 61 and line 62.

The end terminals of inductance 56 are also connected to the anodes of twin triode 49 of the 6J6 type. The anodes of tube 49 as well as its grids and its common cathode are connected to ground; the anodes over condensers 63 and 66 of 4.7 micromicrofarads and over resistances 64 of 27 kiloohms; the grids over resistances 64 and the common cathode over a common resistance 65 of 47 ohms.

Structure and arrangement of inductances, condensers and any other circuit elements provided in the unit, and the various mechanical and electrical connections and couplings therebetween, may be changed or modified in any appropriate manner without exceeding the scope of this invention.

I claim:

1. In a tuning device, stator and rotor structures, a condenser shell supporting electrodes and supported on said stator structure, a plunger movable within said shell with respect to said electrodes for capacity adjustment, a rotary cam of varying thickness and a hollow shaft supporting said cam for rotary motion and supported on said stator structure, another shaft passing through said hollow shaft and supporting said rotor structure to permit independent movement of both shafts, a flexible radial cam follower having one end fixedly attached to said stator structure and the other end insulatingly coupled to the plunger outside said shell; a portion of said cam follower intermediate its ends being in engagement with said rotary cam so as to impart to said plunger a translatory movement under control of a rotary movement of said cam.

2. In a tuning unit, an operator's panel, rotary motion means supported on said panel to be operated from the front of said panel, condenser means supported behind said panel including a cylinder and a plunger freely movable within said cylinder for capacity adjustment, a flexible cam follower extending substantially radially with respect to the axis of rotary motion, having one end fixedly attached to said panel and another end coupled to said plunger; and a rotary cam supported on said rotary motion means extending both in a direction parallel and perpendicular to the axis of rotary motion and engaging said cam follower at a point intermediate its ends to impart to said plunger a translatory motion substantially parallel but eccentric with respect to the axis of rotary motion.

3. In a tuning unit, an operator's panel, rotary motion means supported on said panel to be operated from the front of said panel, condenser means supported behind said panel including a cylinder and a plunger freely movable within said cylinder for capacity adjustment, a wire supporting said plunger at one end thereof, a flexible cam follower extending substantially radially with respect to the axis of rotary motion, having one end fixedly attached to said panel and another end coupled to the other end of said wire, and a spiral shaped cam washer supported on said rotary motion means and engaging said cam follower at a point intermediate its ends to impart to said wire a translatory motion substantially in the direction of said wire and eccentric with respect to the axis of rotary motion.

4. In a tuning unit, an operator's panel, rotary motion means supported on said panel to be operated from the front of said panel, condenser means supported behind said panel including a cylinder of dielectric material having spaced metal layers outside thereof, and a plunger freely movable within said cylinder for capacity adjustment, having a dielectric core, a metallic layer around said core and a wire supporting said core at one end thereof, a flexible cam follower extending substantially radially with respect to the axis of rotary motion, having one end fixedly attached to said panel and another end coupled to the other end of said wire; and a rotary cam washer supported by said rotary motion means and engaging said cam follower at a point intermediate its ends to impart to said wire a translatory motion substantially in the direction of said wire.

5. In a tuning unit, an operator's panel, a shaft rotably supported thereon, a condenser shell of dielectric material having spaced metal layers outside thereof and terminal clips at its ends supported behind said panel, a plunger movable within said shell for capacity adjustment, having a dielectric core and a metallic layer around said core, a wire supporting said core at one end thereof, a flexible cam follower extending substantially radially with respect to said shaft, having one end fixedly attached to said panel and another end coupled to the other end of said wire; and a rotary cam washer supported on said shaft and engaging said cam follower at a point intermediate its ends so that when shaft and washer are rotated said follower will impart to said wire a motion substantially in the direction of said wire.

CHARLES N. EHRLICH.

REFERENCES CITED

The following references are of record in the file of this patent:

UNITED STATES PATENTS

| Number | Name | Date |
|---|---|---|
| 286,215 | Mills | Oct. 9, 1883 |
| 1,632,649 | Hartman | June 14, 1927 |
| 1,633,870 | Potter | June 28, 1927 |
| 2,483,105 | Rennick | Sept. 27, 1949 |

FOREIGN PATENTS

| Number | Country | Date |
|---|---|---|
| 541,712 | Great Britain | Dec. 8, 1941 |